(12) United States Patent
Antesberger et al.

(10) Patent No.: US 6,958,106 B2
(45) Date of Patent: Oct. 25, 2005

(54) MATERIAL SEPARATION TO FORM SEGMENTED PRODUCT

(75) Inventors: Timothy E. Antesberger, Binghamton, NY (US); John S. Kresge, Binghamton, NY (US)

(73) Assignee: Endicott International Technologies, Inc., Endicott, NY (US)

( * ) Notice: Subject to any disclaimer, the term of this patent is extended or adjusted under 35 U.S.C. 154(b) by 317 days.

(21) Appl. No.: 10/409,066

(22) Filed: Apr. 9, 2003

(65) Prior Publication Data

US 2004/0201136 A1 Oct. 14, 2004

(51) Int. Cl.⁷ .......................... B32B 31/08; B32B 31/18
(52) U.S. Cl. .................. 156/249; 156/257; 156/289
(58) Field of Search .................. 156/247, 248, 156/250, 252, 253, 257, 289, 249, 267, 268; 83/23, 27–29, 39, 40, 167, 861, 875

(56) References Cited

U.S. PATENT DOCUMENTS

| | | | |
|---|---|---|---|
| 3,867,179 A | * | 2/1975 | Page .......................... 428/454 |
| 4,006,050 A | * | 2/1977 | Hurst et al. ................. 156/234 |
| 5,011,570 A | * | 4/1991 | Ohbayashi .................. 156/310 |
| 5,106,451 A | | 4/1992 | Kan et al. |
| 5,138,131 A | | 8/1992 | Nishikawa et al. |
| 5,240,755 A | | 8/1993 | Zimmer |
| 5,565,120 A | | 10/1996 | La Rocca |
| 5,578,229 A | | 11/1996 | Barnekov et al. |
| 5,667,707 A | | 9/1997 | Klingel et al. |
| 5,688,418 A | | 11/1997 | Yoshiyasu et al. |
| 5,709,979 A | | 1/1998 | Casson et al. |
| 5,726,079 A | | 3/1998 | Johnson |
| 5,922,225 A | | 7/1999 | Blake |
| 6,288,900 B1 | | 9/2001 | Johnson et al. |
| 6,313,432 B1 | | 11/2001 | Nagata et al. |
| 6,322,655 B1 | * | 11/2001 | Casagrande ................ 156/257 |
| 6,376,798 B1 | | 4/2002 | Renue et al. |
| 6,476,348 B1 | | 11/2002 | Grimes |
| 6,746,051 B1 | * | 6/2004 | Archie et al. ................ 283/56 |
| 2003/0117449 A1 | * | 6/2003 | Cahill et al. ................... 347/7 |

FOREIGN PATENT DOCUMENTS

WO  98/52178  11/1978

OTHER PUBLICATIONS

"DuPont™ Pyralux® HT Insulator Flexible Composites", DuPont Electronic Materials.
Product Handbook for DuPont™ Tyvek®, pp. 1–25.

* cited by examiner

*Primary Examiner*—Chris Fiorilla
*Assistant Examiner*—Chan P. Sing
(74) *Attorney, Agent, or Firm*—Lawrence R. Fraley; Hinman, Howard & Kattell, LLP

(57) ABSTRACT

A method of removing selected portions of material from a base material using a plurality of different depth cuts (e.g., using laser cutting) such that apertured sections (or segments) are expeditiously removed for eventual use with another component or otherwise. In one example, the segmented section so removed can be used to bond various elements of an electronic package which in turn can then be positioned and used within an information handling system such as a computer, server, mainframe, etc.

31 Claims, 3 Drawing Sheets

MATERIAL SEPARATION TO FORM SEGMENTED PRODUCT

TECHNICAL FIELD

This invention relates to material handling and particularly to separation of one material from another wherein the separated material is segmented to subsequently mate with another component for a specific purpose. In one example, the separated segmented material may form an adhesive-type layer to bond various electronic components such as a heat sink to a chip, an electronic package stiffener to a circuitized substrate such as a printed circuit board (PCB), etc.

BACKGROUND OF THE INVENTION

Material separation of several different types of materials is, of course, well known in the art of materials handling. The same is true for separation of materials having openings, slots, etc. therein. One example that comes readily to mind is gasket material for such products as manufacturing equipment, automobiles, etc. As will be defined herein, the present invention is particularly directed (but not limited) to the separation of segmented materials for eventual use in electronic products such as electronic packages, several types of which are known in the electronic field. Examples are shown and described in the following U.S. patents:

U.S. Pat. No. 5,106,451—Kan et al

U.S. Pat. No. 5,726,079—Johnson

U.S. Pat. No. 6,288,900—Johnson et al

An electronic package sold by the assignee of this invention is of particular interest. It is sold under the name HyperBGA®, the "BGA" standing for ball (e.g., solder) grid array meaning a pattern of solder balls are used to bond the package to a selected underlying substrate, typically a laminate PCB. (HyperBGA is a registered trademark of Endicott Interconnect Technologies, Inc., the assignee of the present invention.) This particular package also utilizes a pattern of solder balls to couple the package's chip to its own substrate body, thus affording a more dense package than wirebond or the like packages also on the market. Significantly, the HyperBGA® package also preferably includes what is referred to as a "stiffener" to add rigidity to the final structure by bonding the package's substrate (a laminate) to a heat sink spacedly positioned above the substrate for cooling of the chip during package operation. Further description of this particular electronic package will be provided hereinbelow.

Although the invention defined herein is not meant to be limited for use with electronic packages such as described above, it is particularly useful in such applications, especially to bond one or more elements of the aforementioned HyperBGA® package to form the rigidized structure needed. The segmented material product separated in accordance with the unique teachings herein can be formed in a new and unique manner resulting in significant cost savings to the ultimate package consumer.

It is believed that a method for forming a segmented material offering the advantageous features taught herein, especially in the electronic packaging field, would constitute a significant advancement in the art.

OBJECTS AND SUMMARY OF THE INVENTION

It is a primary object of the invention to enhance the materials handling art.

It is another object of the invention to provide an improved method of separating a particular layer of material from another so as to facilitate subsequent utilization thereof with other components, e.g., so as to effectively bond such components.

It is still another object of the invention to provide such a method which can be accomplished in a facile and less expensive manner than similar methods of material separation known in the materials handling art.

These and other objects are achieved according to one aspect of the invention by the provision of a method comprising the steps of providing a layer of base material, positioning a layer of first material and a layer of release material on the layer of base material such that the layer of release material is located substantially between the layer of base material and the layer of first material, providing a plurality of first cuts substantially only with the layer of first material, providing a plurality of deeper second cuts substantially only within the layer of release material and the layer of first material, and separating the layer of the first material from the layer of base material so as to remove only selected portions of the first material and leave other portions of the first material on the layer of base material.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

As stated above, the separated materials formed herein are useful in many applications but one in particular is in the field of electronic packaging. Examples of such packages are known in the electronic field and examples are provided above. Such packages, typically mounted on an electrically coupled to a circuitized substrate such as a PCB are then usually mounted within a larger electronic system such as a computer, mainframe, server, etc. if utilized in the information handling systems field. By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include the aforementioned personal computers and larger processors such as servers, mainframes, etc. It must be emphasized, however, that the materials formed in accordance with the teachings herein are not limited to such usages, and it is well within the powers of one of ordinary skill in the art to realize that the invention has many additional and distinctly different uses. For ease of description, however, definition of the invention will be with respect to its eventual use within an electronic package and further within an information handling system.

Figure 1:
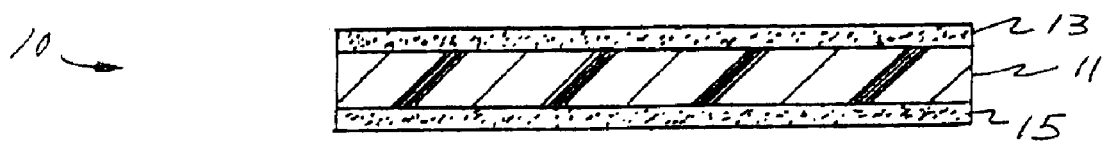
FIG. 1 is a side elevational view, in section, of a material which, when cut as taught herein, can be effectively separated from another material in accordance with the teachings herein.

In FIG. 1 there is shown one example of a first material 10 which may be formed in a segmented manner having portions thereof selectively removed according to a specific design, according to one embodiment of the invention. It is understood that the invention is not limited to this material but can be readily used to provide substantially any similar materials in which selected openings, slots, grooves, etc. are desired in the final product. In the embodiment of FIG. 1, first material 10 is shown as including a layer of dielectric, polymeric material 11 having on opposite sides thereof respective layers of adhesive 13 and 15 respectively. In a preferred embodiment of the invention, material 10 is a recognized flexible circuit material constructed of Kapton polyimide film (11), presently commercially available from E.I. duPont de Nemours under the product name Pyralux. (Pyralux is a registered trademark of duPont.) In a preferred example, the specific Pyralux is known as Pyralux HT, although other versions of this known product are possible. Pyralux HT is available in polyimide film thicknesses from about 0.5 mil to 5 mils and the corresponding adhesive thickness for each layer 13 and 15 within the range of about 0.5 mil to about 3 mils. In its simplest form, Pyralux may be provided with only one side coated with the desired adhesive (a proprietary, flame-retardant, B-staged acrylic epoxy). The invention is not limited to this specific material, however, in that other insulative-adhesive material combinations are readily possible for the eventual use of this product in the manner taught herein.

As will be described hereinbelow, first material 10 may be used to bond a heat sink to a semiconductor chip in an electronic package or find other uses within this environment, e.g., to bond a stiffener or other component occasionally used in such packaging. Further description will be provided with the description of FIG. 6 below.

Typically, materials such as Pyralux when used in the environment defined herein have been relatively difficult to handle, including specifically when cutting and otherwise forming the openings and the external peripheral walls thereof, which, as understood, must be precisely defined if used in relatively small products such as micro-miniature and the like electronic packages. The present invention overcomes these problems while providing a method which can be accomplished in a relatively facile manner.

Figure 2:
FIG. 2 is a side elevational view, in section, showing the material of FIG. 1 positioned on a layer of base material, including a third material located therebetween.

In FIG. 2, the layer of first material 10 is shown as being positioned on the layer of base material 17 with an interim layer of release material 19 located therebetween. This formation is attained by a laminating material 19 to material 10 at a temperature of about 100 degrees Celsius(C.) and pressure of about 50 p.s.i. This is sufficient to bond the two layers for the purposes herein. First material 10 is not shown in cross-sectional configuration for ease of illustration. The preferred release material is also a polymer, Mylar, and with a Pyralux material having dimensions as mentioned above, preferably has a thickness of from about one mil to about three mils. Mylar is a known polyester film material available on the market in various sizes and thicknesses. The layer of base material 17 may, in some conditions, be considered to act as a stiffener or support structure to add rigidity to the final assembly shown in FIG. 2 to enhance the subsequent cutting operations defined below. Substantially any support material of dielectric material or the like may be utilized for base material 17, with a preferred material also being sold by duPont under the registered trademark Tyvek. Tyvek is a tough, durable sheet material made of high density polyethylene fibers which combines the best properties of paper, film and cloth. It is water-resistant, light weight, particulate free, opaque and resistant to chemicals, abrasions and aging. In one example, the Tyvek material possessed a thickness within the range of from about two mils to about ten mils.

As defined hereinbelow, the method of this invention results in the formation of desired cuts within the first material 10 such that this material can then be removed from the base material 17 and utilized as desired. As removed, the first material 10 will include desired openings (see FIG. 4) therein and possess a final external peripheral shape desired for mating with the corresponding structure to which it will bond.

Figure 3:
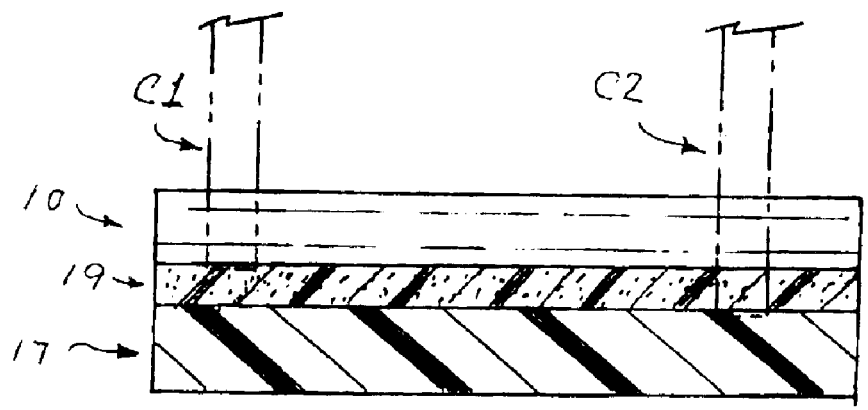
FIG. 3 is a side elevational view, in section, illustrating representative cuts of selected parts of the materials illustrated therein.

In FIG. 3, a series of cutting operations are performed to provide the aforementioned segmented layer of base material. In FIG. 3, at least two different cuts are provided within the subassembly comprised of base material 17, release layer 19 and first material 10. These cuts are provided by a laser, and specifically an ultraviolet (UV) laser. During these cuts, material 17 is held in contact with material 19 using vacuum. Comparing FIGS. 3 and 4 (illustrating a plurality of subassemblies of the type shown in FIG. 3 all integrally formed on a singular, large sheet 21), a series of first cuts C1 are provided and a second series of deeper cuts C2 provided. These are illustrated in phantom in FIG. 3 and also shown in the plan view, but on a smaller scale, in FIG. 4. The first partial cuts C1 penetrate entirely through the Pyralux layer and may partly penetrate the underlying release layer. In comparison, the deeper, second cuts C2 entirely penetrate both the Pyralux and the release layer 19 but not the support layer of Tyvek. It is understood that partial penetration of the Tyvek 10 can and may occur while still achieving the desired results of this invention. The first series of cuts C1 were preferably performed for each of the sections 22 (FIG. 4) at a laser pulse energy of about 0.05 milli-joules to 0.15 milli-joules, a pulse spacing of about 5 micrometers to 15 micrometers, and from about 5 to about 10 passes to achieve the desired depth. In comparison, the corresponding series of deeper cuts C2 for each section were performed at a laser pulse energy of about 0.07 milli-joules to 0.2 milli-joules, a pulse spacing of about 2 micrometers to 10 micrometers, and from about 5 to about 10 passes to achieve the desired depth.

Laser cutting is known in the cutting art, with examples being shown and described in the following patents:

| | |
|---|---|
| 5,138,131 | Nishikawa et al |
| 5,565,120 | La Rocca |
| 5,578,229 | Barnekov et al |
| 5,667,707 | Klingel et al |
| 5,688,418 | Yoshiyasu et al |
| 5,922,225 | Blake |
| 6,313,432B1 | Nagata et al |
| 6,376,798B1 | Remue et al |
| 6,476,348B1 | Grimes |

Further description of this process, except to indicate various laser processing parameters usable for examples of the invention as noted herein, is not believed necessary.

Figure 4:
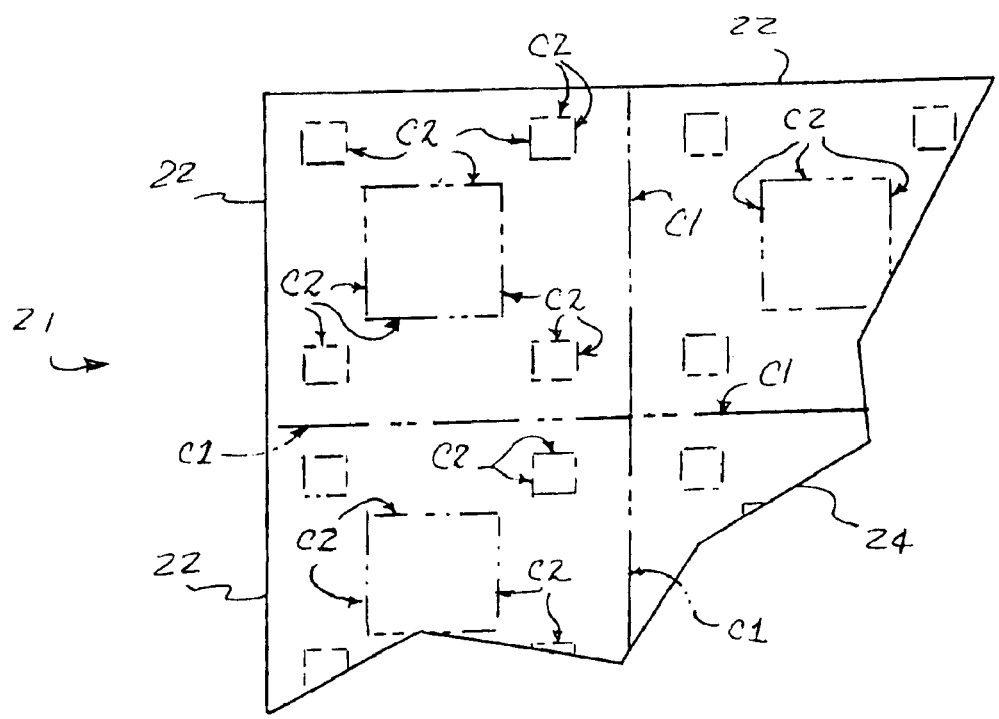
FIG. 4 is a top, partial plan view of part of the structure of FIG. 3, illustrating the various portions thereof that can be individually separated in accordance with the teachings herein.

As understood from the illustration in FIG. 4, the full cuts through the Pyralux and release sheet illustrated by the designators C2 define a plurality of rectangular openings within each respective section 22 of the four sections (three only partially shown) of layer 21 as shown. In on embodiment of the invention, a total of 168 individual sections were formed on one singular large sheet 21, each section having a width dimension of about 40 millimeters (mm) and length dimension of 40 mm. The overall sheet possessed length and width dimensions of 520 mm and 635 mm, respectively. Each section, when removed, will represent a segmented product for future us e as taught herein. The narrower depth cuts C1 shown in FIG. 4 define the peripheral sides of these sections for those sides not already cut as defined by the sheet's external sidewalls.

Figure 5:
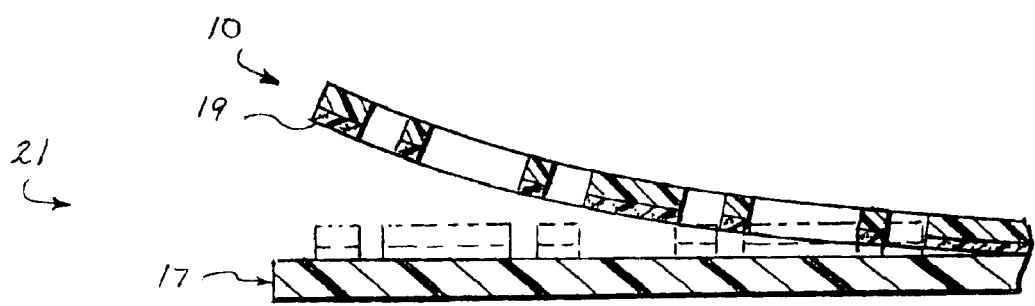
FIG. 5 is a side, elevational view, in section (although the 3-layered structure in FIG. 1 is shown as a single layer), depicting the peel away removal of portions of the layer of first material in FIG. 1 and of the underlying interim (release) layer between it and the underlying base layer of material.

In FIG. 5, there is shown the step of separation of part of the segmented first material 10 and attached release layer 19 from the underlying, supporting base material 17. (In FIG. 5, the Pyralux material is shown in cross-section as a singular layer of dielectric for simplification purposes but it is understood that this material preferably comprises the dielectric and two opposing adhesive layers as shown in FIG. 1. Significantly, by virtue of the differential laser cutting performed in the manner taught herein, only segmented portions of the first material are stripped away, leaving the entirely cut portions defined by cuts C2 still attached to base material 17. These remaining segments are shown in phantom for ease of illustration. However, the removed material is shown in cross-section with these segments removed. The preferred separation technique is simply to peel away the two elements shown in FIG. 5 using known mechanical separation means or even manual separation. Significantly, the adhesive (e.g., Mylar) is of sufficient strength that it retains the respective Pyralux material thereon on the base material while allowing the remaining, substantially fully cut (C2s) to extract the whole depth of the Mylar and Pyralux. This adhesion is partly due to the fact that the full cuts C2 which do not penetrate the Tyvek and are provided at sufficient laser energy to substantially fuse (melt) the release layer of Mylar to the Tyvek at the cut locations.

As thus seen in FIG. 5, the removed strip includes the desired openings (i.e., four small rectangular openings and one large central rectangular opening per section) therein. In an alternative embodiment of the invention, it is possible to selectively remove individual sections 22 from the larger sheet 21 by providing full depth cuts C2 instead of cuts C1 at the defined energy levels, pulse spacings and passes cited hereinabove. This in turn will allow for individual removal of each section 22 from the support layer 17 while still leaving the desired segments affixed thereto. These C2 cuts, which do not penetrate the underlying Tyvek material, are preferably provided at a lower pulse energy so as to avoid fusing the Mylar and Tyvek, thus expediting such individual removal. The invention is thus able to provide both individual segment (section) removal or complete removal of the segments en masse for later separation.

Figure 6:
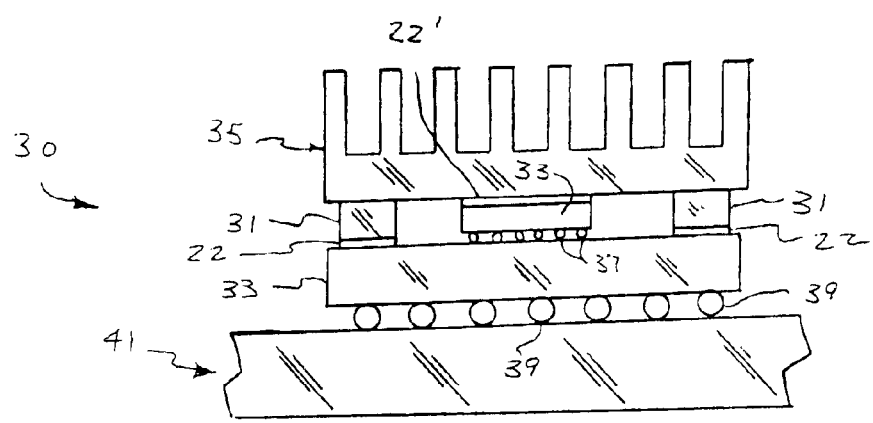
FIG. 6 illustrates a side view, in elevation, of an electronic package which includes elements that can be assembled using the separated material of FIG. 5.
Figure 7:
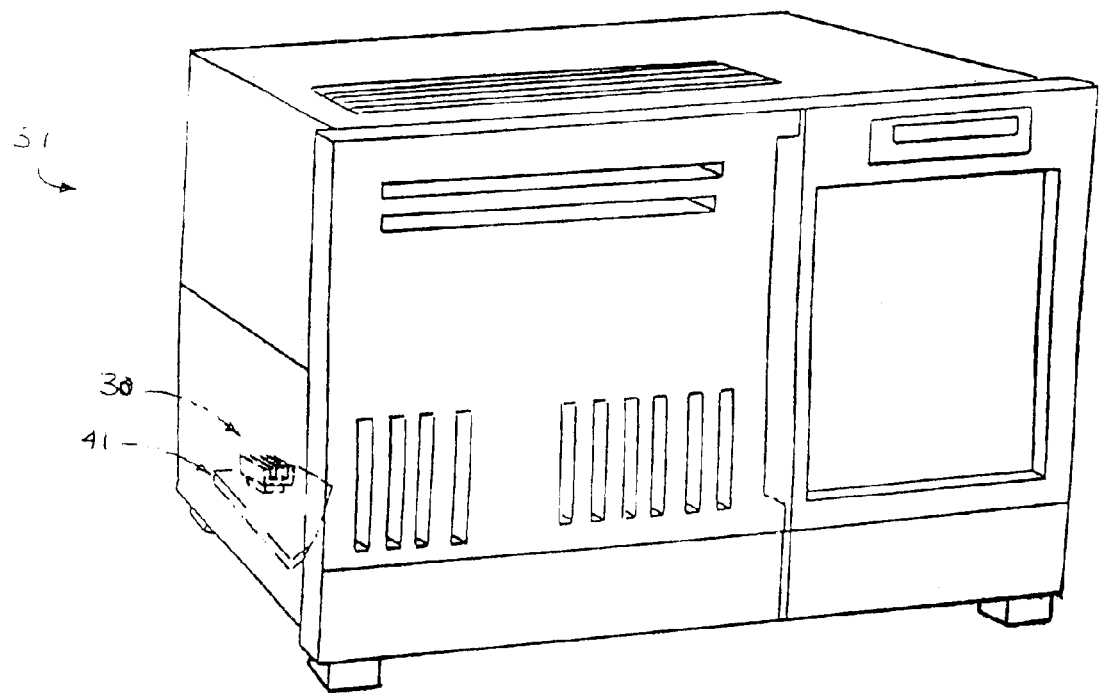
FIG. 7 illustrates an information handling system, e.g., a computer server, which can utilize one or more of the electronic packages formed using the separated material formed in accordance with the method taught herein.

In FIG. 6 there is seen an electronic package 30 which can utilize the segmented product produced by the present invention. In one example, one of the removed, apertured sections 22 may be utilized as the adhesive component between the package's stiffener or strengthening member 31 to bond this member to the laminate substrate 33. If so used, this section 22 would be located under the stiffener and is thus also represented by the numeral 22 in FIG. 6. It is understood that the proportions of the view in FIG. 4 do not necessarily match those in FIG. 6 with respect to the selected section 22. Specifically, the internal rectangular opening in one of the sections in 22 is shown to be much larger in FIG. 6, the package's semiconductor chip 35 being positioned within said opening. Although not specifically shown, the section 22 can also be used to bond the stiffener 31 to the package's heat sink 35 also positioned thereon. Still further, a smaller portion of removed material can be used to bond the chip to the heat sink, in which case it would be located in a position referenced by the numeral 22'. The chip is shown as being electrically coupled to the circuitized laminate substrate 33 by a plurality of solder balls 37 which couple selected sites on the chip to corresponding pads on the laminate's upper surface. Internal conductive pads, including conductive vias and/or plated through holes, and a plurality of conductive planes (e.g., signal, ground or power) are also utilized in the laminate and selected ones thereof utilized to couple the chip to external conductors on the laminate's undersurface which in turn are coupled by a second plurality of solder balls 39 to pads (not shown) on underlying circuitized substrate 41, a preferred example being a conventional printed circuit board. This completed assembly is then adapted for being positioned within an information handling system 51 as shown in FIG. 7 which, as stated above, may comprise a computer, server, mainframe or other information handling component known in the art, many of which utilize circuit boards and packages of the type shown above.

It is thus understood that a selected, segmented section 22 formed and removed using the unique teachings herein from a base support layer is then utilized to produce an electronic package for eventual use within an information handling system. The product as produced herein is thus attainable utilizing a new and unique bonding structure to greatly facilitate assembly of a larger subassembly (e.g., an electronic package) and an even larger electronic assembly such as an information handling system.

It is again understood, however, that the teachings of this invention are not limited to such electronic applications but may be utilized in many other embodiments in which a segmented piece of material is desired for mating with the corresponding component or the like to provide some needed function (e.g., bonding) for said component. It is thus believed that the present invention represents a significant advancement in the art, wherein such bonding is desired.

While there have been shown and described what are at present the preferred embodiments of the invention, it will be obvious to those skilled in the art that various changes and modifications may be made therein without departing from the scope of the invention as defined by the appended claims.

What is claimed is:

1. A method of removing selected portions of a first material from a base material, said method comprising:

providing a layer of base material;

positioning a layer of first material and a layer of release material on said layer of base material such that said layer of release material is located substantially between said layer of base material and said layer of first material, said layer of first material consisting of three sublayers, a first of said sublayers being comprised of a polymer and the second and third of said sublayers comprised of an adhesive and located on opposite sides of said first sublayer;

providing a plurality of first cuts through said layer of first material;

providing a plurality of deeper, second cuts through said layer of release material and said layer of first material; and separating said layer of said first material from said layer of base material so as to remove only selected portions of said first material and leave other portions of said first material on said layer of base material.

2. The method of claim 1 wherein said plurality of first cuts are provided using a laser.

3. The method of claim 2 wherein said laser is a UV laser.

4. The method of claim 1 wherein said plurality of second cuts are provided using a laser.

5. The method of claim 4 wherein said laser is a UV laser.

6. The method of claim 1 wherein said layer of release material is comprised of a polymer material.

7. The method of claim 1 wherein said layer of release material is comprised of a polyester film.

8. The method of claim 1 wherein said layer of base material is comprised of a polymer material.

9. The method of claim 8 wherein said polymer material is comprised of high-density polyethylene fibers.

10. The method of claim 1 wherein said plurality of first cuts are provided using a laser pulse energy of from about 0.05 milli-joules to about 0.15 milli-joules and a pulse spacing within the range of from about five micrometers to about fifteen micrometers.

11. The method of claim 10 wherein said plurality of second cuts are provided using a laser pulse energy of from about 0.07 milli-joules to about 0.20 milli-joules and a pulse spacing within the range of from about two micrometers to about ten micrometers.

12. The method of claim 1 wherein further including providing a first circuitized substrate and a component, said method further including securing said component to said circuitized substrate using said first material.

13. The method of claim 12 further including electrically coupling a semiconductor chip to said first circuitized substrate adjacent said component.

14. The method of claim 12 further including electrically coupling said first circuitized substrate to a second circuitized substrate.

15. The method of claim 14 further including positioning said first and second circuitized substrates within an information handling system to form part of said information handling system.

16. A method of removing selected portions of a first material from a base material, said method comprising:

providing a layer of base material;

positioning a layer of first material and a layer of release material on said layer of base material such that said layer of release material is located substantially between said layer of base material and said layer of first material, said layer of said first material being comprised of an adhesive;

providing a plurality of first cuts through said layer of first material;

providing a plurality of deeper, second cuts through said layer of release material and said layer of first material;

separating said layer of said first material from said layer of base material so as to remove only selected portions of said first material and leave other portions of said first material on said layer of base material;

providing a first circuitized substrate and a component; and securing said component to said first circuitized substrate using said selected portions of said first material.

17. The method of claim 16 wherein said plurality of first cuts are provided using a laser.

18. The method of claim 17 wherein said laser is a UV laser.

19. The method of claim 16 wherein said plurality of second cuts are provided using a laser.

20. The method of claim 19 wherein said laser is a UV laser.

21. The method of claim 16 wherein said layer of first material is comprised of three sublayers.

22. The method of claim 21 wherein said layer of first material is comprised of a first sublayer of polymer material and second and third sublayers of said adhesive located on opposite sides of said first sublayer.

23. The method of claim 16 wherein said layer of release material is comprised of a polymer material.

24. The method of claim 23 wherein said layer of release material is comprised of a polyester film.

25. The method of claim 16 wherein said layer of base material is comprised of a polymer material.

26. The method of claim 25 wherein said polymer material is comprised of high-density polyethylene fibers.

27. The method of claim 16 wherein said plurality of first cuts are provided using a laser pulse energy of from about 0.05 milli-joules to about 0.15 milli-joules and a pulse spacing within the range of from about five micrometers to about fifteen micrometers.

28. The method of claim 27 wherein said plurality of second cuts are provided using a laser pulse energy of from about 0.07 milli-joules to about 0.20 milli-joules and a pulse spacing within the range of from about two micrometers to about ten micrometers.

29. The method of claim 16 further including electrically coupling a semiconductor chip to said first circuitized substrate adjacent said component.

30. The method of claim 16 further including electrically coupling said first circuitized substrate to a second circuitized substrate.

31. The method of claim 30 further including positioning said first and second circuitized substrates within an information handling system to form part of said information handling system.

* * * * *

UNITED STATES PATENT AND TRADEMARK OFFICE
CERTIFICATE OF CORRECTION

PATENT NO. : 6,958,106 B2
DATED : October 25, 2005
INVENTOR(S) : T. Antesberger et al.

Page 1 of 1

It is certified that error appears in the above-identified patent and that said Letters Patent is hereby corrected as shown below:

<u>Title page,</u>
Item [73], Assignee, "Endicott International Technologies, Inc., Endicott, NY (US)"
should read -- Endicott Interconnect Technologies, Inc., Endicott, NY (US) --.

Signed and Sealed this

Twenty-first Day of March, 2006

JON W. DUDAS
*Director of the United States Patent and Trademark Office*